United States Patent
Kanematsu et al.

(10) Patent No.: US 12,453,055 B2
(45) Date of Patent: Oct. 21, 2025

(54) TERMINAL BLOCK

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yuta Kanematsu, Mie (JP); Junichi Mukuno, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 272 days.

(21) Appl. No.: 18/033,681

(22) PCT Filed: Nov. 8, 2021

(86) PCT No.: PCT/JP2021/040935
§ 371 (c)(1),
(2) Date: Apr. 25, 2023

(87) PCT Pub. No.: WO2022/102560
PCT Pub. Date: May 19, 2022

(65) Prior Publication Data
US 2023/0397373 A1    Dec. 7, 2023

(30) Foreign Application Priority Data
Nov. 12, 2020    (JP) ................. 2020-188767

(51) Int. Cl.
*H05K 7/20* (2006.01)
*H01R 13/53* (2006.01)
*H05K 9/00* (2006.01)

(52) U.S. Cl.
CPC ......... *H05K 7/20436* (2013.01); *H01R 13/53* (2013.01); *H05K 9/0024* (2013.01); *H01R 2201/26* (2013.01)

(58) Field of Classification Search
CPC .. H05K 7/20436; H05K 9/0024; H01R 13/53; H01R 2201/26
(Continued)

(56) References Cited

U.S. PATENT DOCUMENTS

| | | | |
|---|---|---|---|
| 2003/0171042 A1* | 9/2003 | Miyazaki | H01R 13/748 439/859 |
| 2003/0207607 A1* | 11/2003 | Matsumoto | H01R 13/6485 439/357 |

(Continued)

FOREIGN PATENT DOCUMENTS

| | | |
|---|---|---|
| CN | 206727375 U | 12/2017 |
| JP | 2007-258010 A | 10/2007 |

(Continued)

OTHER PUBLICATIONS

International Search Report issued on Dec. 14, 2021 for WO 2022/102560 A1 (4 pages).

*Primary Examiner* — Zhengfu J Feng
(74) *Attorney, Agent, or Firm* — Venjuris, P.C.

(57) ABSTRACT

A terminal block of a novel structure is disclosed which can improve the heat dissipation performance of a terminal while achieving a size reduction with a small number of components. The terminal block is provided with a terminal including a connecting portion to be connected to a mating terminal on a tip side and a fixing portion on a base end side, a shield shell made of metal and including a tubular recep- (Continued)

tacle for surrounding the connecting portion of the terminal, a holding tube portion for surrounding the fixing portion of the terminal and a contact portion to be held in thermal contact with an external heat dissipation target and a filling resin portion for integrally fixing the fixing portion of the terminal to the holding tube portion of the shield shell by filling up between facing surfaces of the fixing portion and the holding tube portion.

9 Claims, 3 Drawing Sheets

(58) Field of Classification Search
USPC .......................................................... 361/704
See application file for complete search history.

(56) References Cited

U.S. PATENT DOCUMENTS

| | | | |
|---|---|---|---|
| 2011/0014822 A1* | 1/2011 | Kato ................ | H01R 13/65912 |
| | | | 439/733.1 |
| 2012/0040553 A1* | 2/2012 | Tashiro .............. | H01R 13/6315 |
| | | | 439/660 |
| 2015/0126055 A1* | 5/2015 | Morita ................... | H01R 24/28 |
| | | | 439/323 |

FOREIGN PATENT DOCUMENTS

| | | |
|---|---|---|
| JP | 2015-011816 A | 1/2015 |
| JP | 2017-224541 A | 12/2017 |
| JP | 2018-113119 A | 7/2018 |
| JP | 2021-150100 A | 9/2021 |

* cited by examiner

TERMINAL BLOCK

CROSS REFERENCE TO RELATED APPLICATIONS

This application is a national phase of PCT application No. PCT/JP2021/040935, filed on Nov. 8, 2021, which claims priority from Japanese patent application No. 2020-188767, filed on Nov. 12, 2020, all of which are incorporated herein by reference.

TECHNICAL FIELD

The present disclosure relates to a terminal block.

BACKGROUND

Conventionally, an in-vehicle device to be installed in a vehicle such as an electric vehicle is provided with a terminal block enabling electrical connection to the outside of this in-vehicle device. For example, Patent Document 1 discloses a terminal block with a shielding function including a shield shell for shielding around an insulating housing having terminals accommodated and arranged therein.

In such a terminal block, gaps are formed between the terminals and the insulating housing and between the insulating housing and the shield shell. Thus, a structure is adopted which promotes heat transfer from the connector terminals to the insulating housing and the shield shell and suppresses a temperature rise of the connector terminals by providing a resilient heat absorbing sheet between those.

PRIOR ART DOCUMENT

Patent Document

Patent Document 1: JP 2007-258010 A

SUMMARY OF THE INVENTION

Problems to be Solved

However, in such a structure, the separate heat absorbing sheet is necessary and the number of components and assembly manhours are unavoidably increased. Further, since a heat transfer path is configured via a plurality of members, problems of high heat resistance and unavoidable enlargement of the terminal block have been inherent.

Accordingly, a terminal block of a novel structure is disclosed which can improve the heat dissipation performance of a terminal while achieving a size reduction with a small number of components.

Means to Solve the Problem

The present disclosure is directed to a terminal block with a terminal including a connecting portion to be connected to a mating terminal on a tip side and a fixing portion on a base end side, a shield shell made of metal, the shield shell including a tubular receptacle for surrounding the connecting portion of the terminal, a holding tube portion for surrounding the fixing portion of the terminal and a contact portion to be held in thermal contact with an external heat dissipation target, and a filling resin portion for integrally fixing the fixing portion of the terminal to the holding tube portion of the shield shell by filling up between facing surfaces of the fixing portion of the terminal and the holding tube portion of the shield shell.

Effect of the Invention

According to the terminal block of the present disclosure, it is possible to improve the heat dissipation performance of the terminal while achieving a size reduction with a small number of components.

DETAILED DESCRIPTION TO EXECUTE THE INVENTION

<Description of Embodiments of Present Disclosure>

Figure 1:
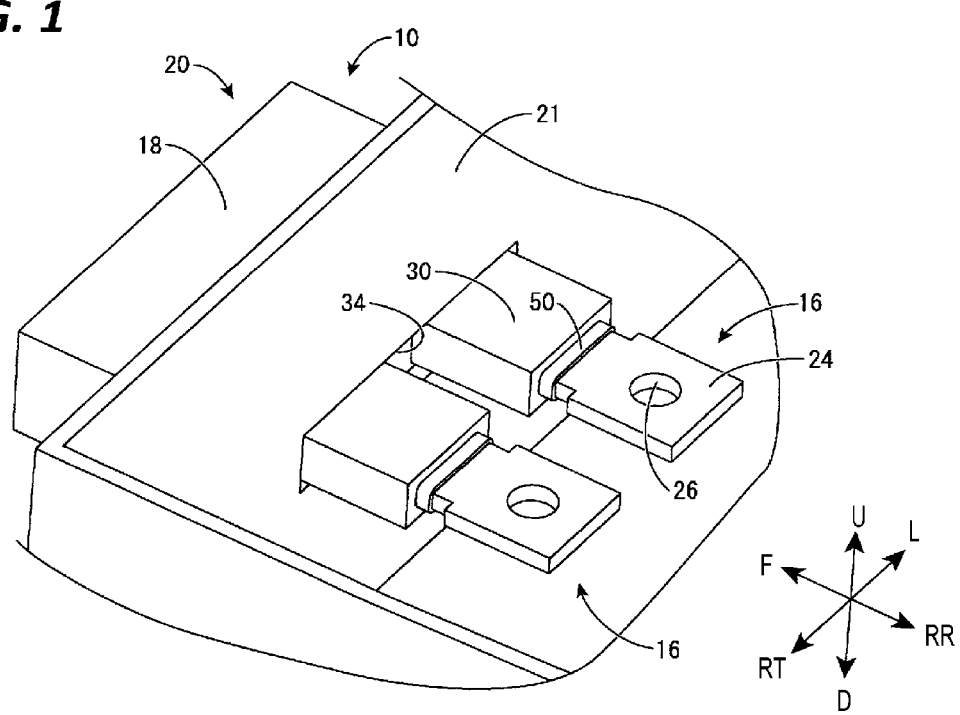
FIG. 1 is an overall perspective view showing a state where a terminal block according to one embodiment is mounted on a case made of metal and serving as an external heat dissipation target.
Figure 2:
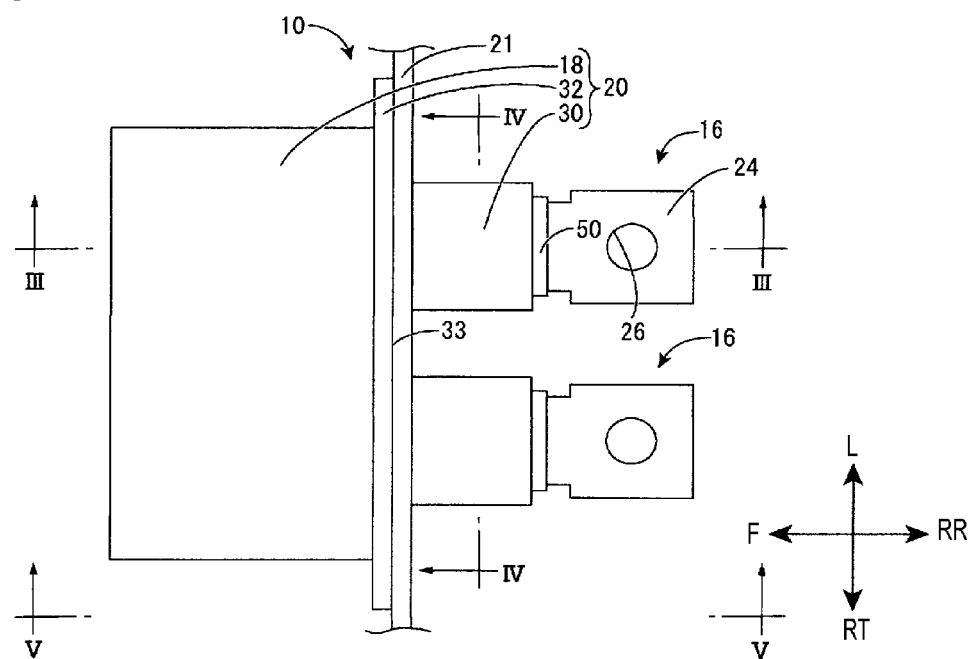
FIG. 2 is a plan view of FIG. 1.

First, embodiments of the present disclosure are listed and described.

(1) The terminal block of the present disclosure is provided with a terminal including a connecting portion to be connected to a mating terminal on a tip side and a fixing portion on a base end side, a shield shell made of metal, the shield shell including a tubular receptacle for surrounding the connecting portion of the terminal, a holding tube portion for surrounding the fixing portion of the terminal and a contact portion to be held in thermal contact with an external heat dissipation target, and a filling resin portion for integrally fixing the fixing portion of the terminal to the holding tube portion of the shield shell by filling up between facing surfaces of the fixing portion of the terminal and the holding tube portion of the shield shell.

According to the terminal block of the present disclosure, the shield shell and the terminal are integrated by the filling resin portion for filling up between the facing surfaces of the fixing portion of the terminal and the holding tube portion of the shield shell. Thus, a fixing structure and an insulating structure for the shield shell and the terminal are simplified and the entire terminal block can be reduced in size. Moreover, the filling resin portion fills up between the fixing portion of the terminal and the holding tube portion of the shield shell without any gap. Thus, heat generated in the terminal due to energization is efficiently transferred to the holding tube portion of the shield shell without via an air layer. Further, the contact portion provided on the shield shell made of metal is in thermal contact with the external heat dissipation target, whereby the heat generated in the terminal can be efficiently transferred to the external heat dissipation target such as a metal-made case of an in-vehicle device via the filling resin portion and the shield shell made of metal. As a result, the heat dissipation performance of the terminal of the terminal block is advantageously improved. As a result of improving the heat dissipation performance of the terminal, terminals smaller in size can be adopted and it becomes possible to provide a terminal block miniaturizable at lower cost.

(2) Preferably, the filling resin portion includes a flange portion projecting from a first opening of the holding tube portion on the receptacle side and expanding to cover a bottom surface of the receptacle. The filling resin portion includes the flange portion projecting from the first opening of the holding tube portion on the receptacle side and expanding to cover the bottom surface of the receptacle. Thus, by appropriately adjusting the size of the flange portion, the fixing performance of the filling resin portion to the shield shell can be advantageously improved while creepage distances of the terminal and the shield shell made of metal are secured with a high degree of freedom in design. Further, since the facing surfaces of the filling resin portion and the holding tube portion are covered by the flange portion and the flange portion and the bottom surface of the receptacle are integrated, the occurrence of troubles such as a reduction in heat transfer performance caused by peeling between the facing surfaces of the filling resin portion and the holding tube portion is advantageously suppressed or prevented.

(3) Preferably, the filling resin portion includes a projecting portion projecting from a second opening of the holding tube portion on a side opposite to the receptacle and exposed to outside. The filling resin portion includes the projecting portion projecting from the second opening of the holding tube portion on the side opposite to the receptacle and exposed to outside. Thus, creepage distances of the holding tube portion of the shield shell and a member on the in-vehicle device side or the like can be secured with a high degree of freedom in design by appropriately adjusting a length of the projecting portion. Further, even if waterdrops adhere near the second opening, the occurrence of troubles such as the waterdrops entering and staying in the holding tube portion can also be prevented.

(4) Preferably, the fixing portion of the terminal is provided with a recess open on an outer surface, and the filling resin portion includes an engaging protrusion for filling the recess. Since the engaging protrusion of the filling resin portion is provided to enter the recess open on the outer surface of the fixing portion of the terminal, the separation of the terminal and the filling resin portion can be advantageously suppressed or hindered even if an insertion/withdrawal force is applied to the terminal.

(5) Preferably, the connecting portion has a flat plate shape extending in a longitudinal direction of the terminal while having a rectangular cross-section, and a tip surface, both side surfaces, an upper surface and a lower surface of the connecting portion are not covered by the filling resin portion at least on a tip side of the connecting portion. Since the tip surface, the both side surfaces, the upper surface and the lower surface of the connecting portion are not covered by the filling resin portion, the terminal can be stably held by a mold in the case of arranging the shield shell and the terminal in the mold and injection-molding the filling resin portion. As a result, the positioning performance of the terminal with respect to the shield shell is improved, and a gap dimension between the facing surfaces of the fixing portion of the terminal and the holding tube portion of the shield shell can be made as small as possible. As a result, a thickness of the filling resin portion in a part filling up between the facing surfaces of the fixing portion of the terminal and the holding tube portion of the shield shell can be reduced to a resilience limit, and the heat transfer performance from the terminal to the shield shell via the filling resin portion can be more advantageously improved.

(6) Preferably, a thickness of the filling resin portion arranged between the facing surfaces of the fixing portion of the terminal and the holding tube portion of the shield shell is 1.5 mm or less. Since the thickness of the filling resin portion arranged between the facing surfaces of the fixing portion of the terminal and the holding tube portion of the shield shell is 1.5 mm or less, the heat transfer performance from the terminal to the shield shell via the filling resin portion can be more advantageously improved.

(7) Preferably, the shield shell includes a fixing projection piece expanding into a flange shape around the receptacle, and the contact portion of the shield shell is constituted by an overlapping surface of the fixing projection piece on the heat dissipation target. The contact portion of the shield shell can be provided, utilizing the fixing projection piece provided on the shield shell and fixed to the external heat dissipation target, the contact portion can be provided with a small number of components, and both the size reduction and the heat dissipation performance can be achieved.

<Details of Embodiment of Present Disclosure>

A specific example of a terminal block of the present disclosure is described below with reference to the drawings. Note that the present disclosure is not limited to these illustrations, but is represented by claims and intended to include all changes in the scope of claims and in the meaning and scope of equivalents.

<Embodiment>

Figure 3:
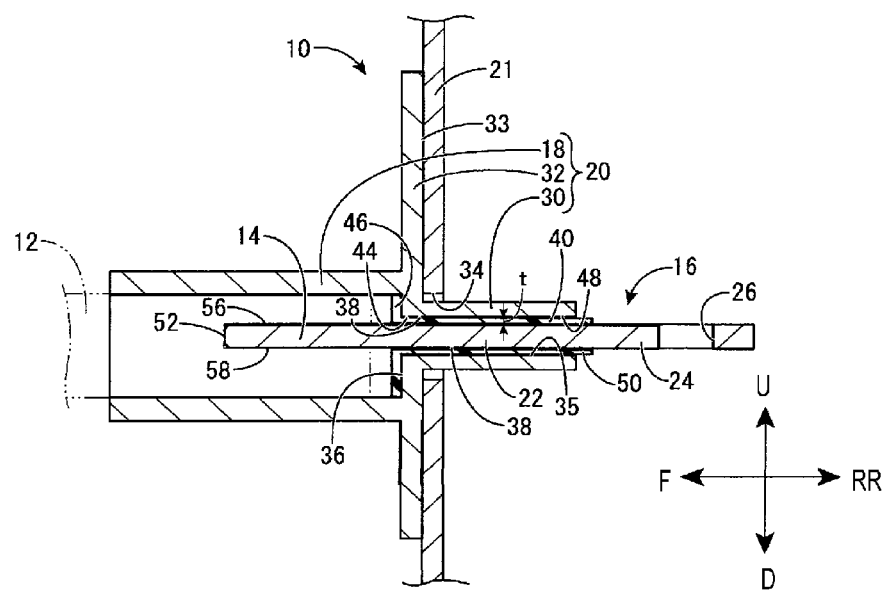
FIG. 3 is a section along in III-III FIG. 2.
Figure 4:
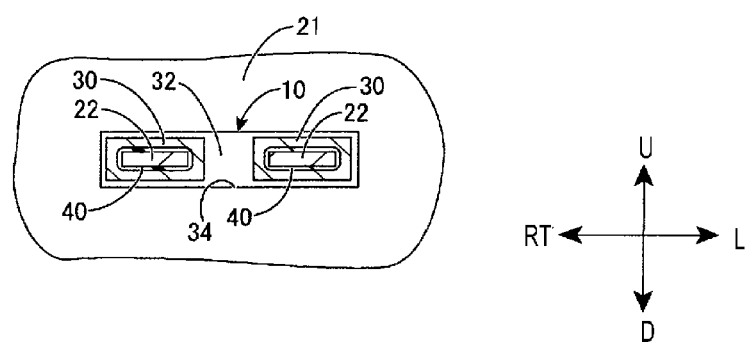
FIG. 4 is a section along IV-IV in FIG. 2.
Figure 5:
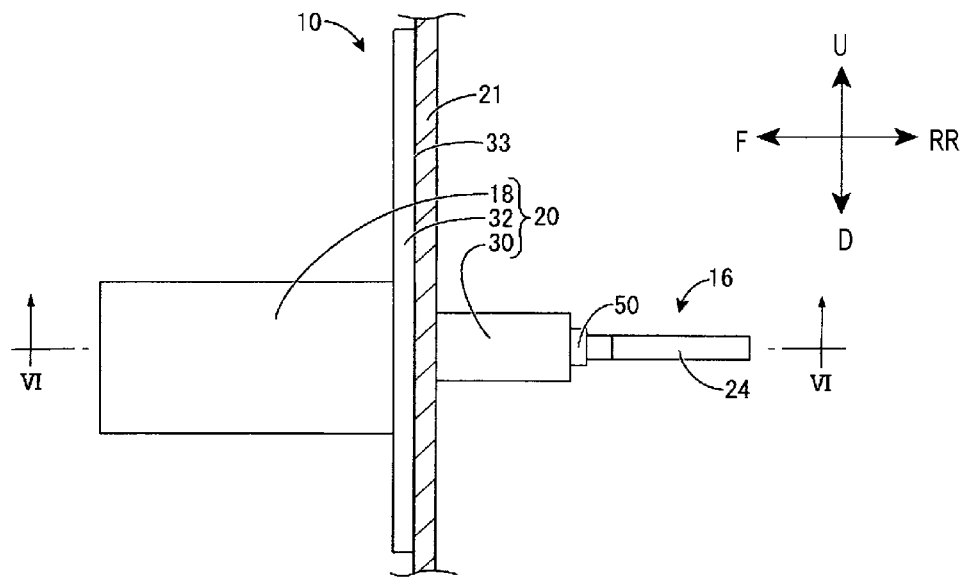
FIG. 5 is a section along V-V in FIG. 2.

Hereinafter, a terminal block 10 of one embodiment of the present disclosure is described using FIGS. 1 to 6. As shown in FIG. 3, the terminal block 10 is provided with a pair of terminals 16, 16 each including a connecting portion 14 to be connected to a mating terminal 12 on a tip side, and a shield shell 20 including a receptacle 18 in the form of a rectangular tube surrounding the connecting portions 14 of the terminals 16. The terminal 10 is, for example, used by being mounted into a metal-made case 21 of an inverter serving as an external heat dissipation target. Note that the terminal 10 can be arranged in an arbitrary orientation, but a vertical direction, a lateral direction and a front-rear direction are described below based on a vertical direction, a lateral direction and a front-rear direction shown in figures. Further, for a plurality of identical members, only some members may be denoted by a reference sign and the other members may not be denoted by the reference sign. Furthermore, the mating terminal 12 is shown only in FIG. 3 and drawn by an imaginary line to facilitate understanding.

<Terminal 16>

Figure 6:
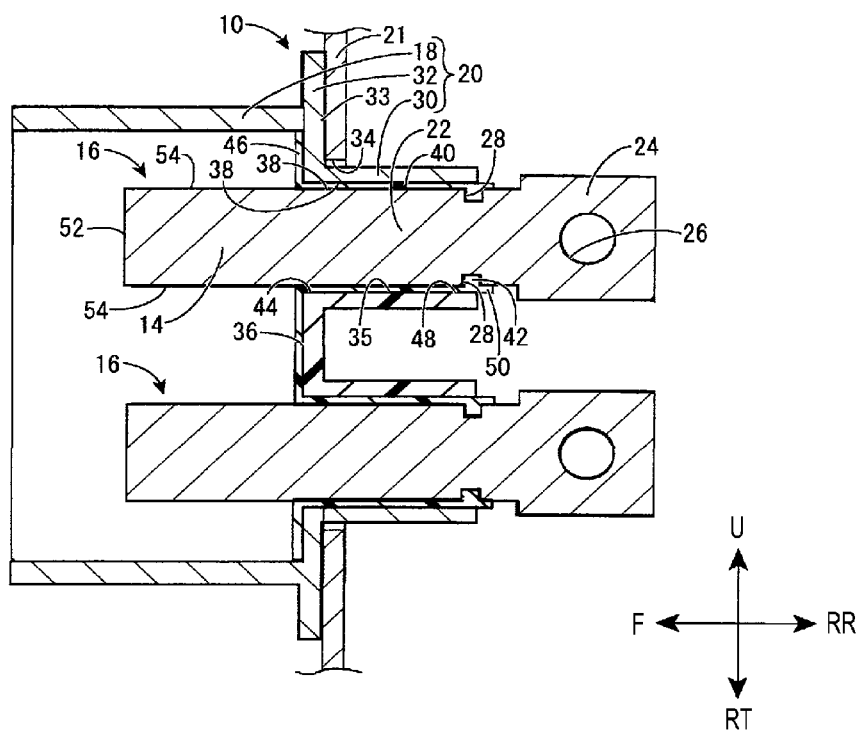
FIG. 6 is a section along VI-VI in FIG. 5.

As shown in FIGS. 3 and 6, the terminal 16 has a flat plate shape. A metal material such as copper, copper alloy, aluminum, aluminum alloy or stainless steel can be appropriately used as a material of the terminal 16. A surface processing such as silver plating, tin plating or aluminum plating may be applied to the terminal 16 according to the type of the constituent metal and a use environment. The terminal 16 can be formed, for example, by press-stamping a metal plate excellent in electrical conductivity. The terminal 16 includes, on the tip side (front side in FIG. 3), the connecting portion 14 having a flat plate shape extending in a longitudinal direction (front-rear direction in FIGS. 3 and 6) of the terminal 16 while having a rectangular cross-section. Further, the terminal 16 includes a fixing portion 22 connected to the rear end of the connecting portion 14 on a base end side (rear side in FIG. 3). The fixing portion 22 has a flat plate shape extending in the longitudinal direction of the terminal 16 while having a rectangular cross-section. Further, the terminal 16 is formed with a fastening portion 24 connected to the rear end of the fixing portion 22 and having a rectangular flat plate shape on the more base end side (rear end side in FIG. 3) than the fixing portion 22. The fastening portion 24 includes a bolt insertion hole 26 penetrating in a central part, projects from the shield shell 20 to be exposed to outside, and is fastened to a terminal of an unillustrated in-vehicle device. In addition, as shown in FIG. 6, the terminal 16 is provided with recesses 28 penetrating through outer surfaces, i.e. in a plate thickness direction and open outward in a plate width direction on both end parts in the plate width direction of an end part of the fixing portion 22 on the side of the fastening portion 24.

<Shield Shell 20>

As shown in FIGS. 1 to 6, the terminal 16 is used by being accommodated into the shield shell 20 of the terminal block 10. The shield shell 20 is formed of electrically conductive metal. The shield shell 20 includes a single receptacle 18 for accommodating the connecting portions 14 of the pair of terminals 16 side by side in the plate width direction on a front side, and a pair of holding tube portions 30, 30 in the form of rectangular tubes surrounding the fixing portions 22 of the terminals 16 and separated in the plate width direction on a rear side. The receptacle 18 is larger than the holding tube portions 30. Further, the shield shell 20 is provided with a fixing projection piece 32 expanding into a flange shape in a direction orthogonal to a longitudinal direction of the receptacle 18 and the pair of holding tube portions 30, 30 between the receptacle 18 and the pair of holding tube portions 30, 30. As shown in FIG. 3, the fixing projection piece 32 is mounted on the metal-made case 21 serving as the external heat dissipation target and held in close contact with the case 21, whereby a contact portion 33 is constituted by a thermally contacting part. That is, the shield shell includes the fixing projection piece 32 expanding into a flange shape around the receptacle 18, and the contact portion 33 of the shield shell 20 is configured by an overlapping surface of the fixing projection piece 32 on the case 21. Here, as shown in FIGS. 1 and 3, insertion holes 34 through which the pair of holding tube portions 30, 30 are inserted are provided in the front surface of the case 21. Further, the fixing projection piece 32 is provided with a pair of communication holes 35, 35 allowing communication between the receptacle 18 and the insides of the pair of holding tube portions 30, 30, and the communication hole 35 is formed over the entire surface of the bottom wall of the holding tube portion 30. As shown in FIG. 3, the communication hole 35 is formed at a somewhat upper position of a bottom surface 36 of the receptacle 18.

<Filling Resin Portion 40>

As shown in FIGS. 3 and 6, a synthetic resin is filled into between facing surfaces 38, 38 of the fixing portion 22 of the terminal 16 and the holding tube portion of the shield shell 20, thereby forming a filling resin portion 40. The fixing portion 22 of the terminal 16 is integrally fixed to the holding tube portion 30 of the shield shell by the filling resin portion 40. Here, a thickness: t (see FIG. 3) of the filling resin portion 40 arranged between the facing surfaces 38, 38 of the fixing portion 22 of the terminal 16 and the holding tube portion 30 of the shield shell 20 is set to be 1.5 mm or less. In this embodiment, this thickness t is 1.5 mm. In this way, heat transfer performance from the terminal 16 to the shield shell 20 via the filling resin portion 40 can be more advantageously improved. Further, as shown in FIG. 6, the filling resin portion 40 is also filled in the pair of recesses 28, 28 provided at the rear end of the fixing portion 22 of the terminal 16 and includes engaging protrusions 42 filling the recesses 28. As a result, even if an insertion/withdrawal force is applied to the terminal 16, the separation of the terminal 16 and the filling resin portion 40 can be advantageously suppressed or hindered. Further, as shown in FIGS. 3 and 6, the filling resin portion 40 includes a flange portion 46 projecting from a first opening 44 of the holding tube portion 30 on the side of the receptacle 18 and expanding to cover the bottom surface 36 of the receptacle 18. In addition, the filling resin portion 40 includes a projecting portion 50 projecting from a second opening 48 of the holding tube portion 30 on a side opposite to the receptacle 18 and exposed to outside. In this way, the filling resin portion 40 is reliably filled between the facing surfaces 38 and 38, and the fixing portion 22 of the terminal 16 is more strongly fixed to the holding tube portion 30 of the shield shell 20. As a result of the above, as shown in FIGS. 3 and 6, a tip surface 52, both side surfaces 54, 54, an upper surface 56 and a lower surface 58 of the connecting portion 14 are not covered by the filling resin portion 40 and the connecting portion 14 is exposed on a tip side of the connecting portion 14 of the terminal 16.

<Manufacturing Method of Terminal Block 10>

One embodiment of a manufacturing method of the terminal block 10 is described. First, the single shield shell 20 and the pair of terminals 16, 16 formed into predetermined shapes are prepared. Note that the terminal block 10 is manufactured, for example, using unillustrated two molds. More particularly, the two molds are composed of the mold arranged on a front side and the mold arranged on a rear side. Subsequently, the pair of terminals 16, 16 are inserted through the pair of communication holes 35, 35 of the single shield shell 20. In this state, the two molds are so arranged that the pair of terminals 16, 16 are at predetermined positions with respect to the single shield shell 20. That is, in this state, parts of the single shield shell 20 and the pair of terminals 16, 16 not covered by the filling resin portion 40 are covered by the two molds. Then, by injecting/filling the resin into a gap formed by the two molds, the terminal block 10 is completed.

According to the terminal block 10 of the present disclosure thus structured, the fixing portion 22 of the terminal 16 is integrally fixed to the holding tube portion 30 of the shield shell 20 by the filling resin portion 40. Since a fixing structure and an insulating structure for the terminal 16 and the shield shell 20 can be simplified in this way, the entire terminal block 10 can be reduced in size. Moreover, the filling resin portion 40 fills up between the facing surfaces 38, 38 of the fixing portion 22 of the terminal 16 and the holding tube portion 30 of the shield shell 20 without any gap. Thus, even if heat is generated in the terminal 16 due to energization, the heat is efficiently dissipated to the holding tube portion 30 of the shield shell 20 without via an air layer. Further, the contact portion 33 provided on the shield shell 20 is in thermal contact with the case 21 serving as the external heat dissipation target. In this way, heat generated in the terminal 16 can be efficiently dissipated to the external heat dissipation target such as the case 21 via the filling resin portion 40 and the shield shell 20. Therefore, the heat dissipation performance of the terminal 16 of the terminal block 10 is advantageously improved. As a result of improving the heat dissipation performance of the terminal 16, terminals smaller in size can be adopted and it becomes possible to provide a terminal block miniaturizable at lower cost.

On the tip side of the connecting portion 14 of the terminal 16, the tip surface 52, the both side surfaces 54, 54, the upper surface 56 and the lower surface 58 of the connecting portion 14 are not covered by the filling resin portion 40 and the connecting portion 14 is exposed. Thus, the terminal 16 can be stably held by the molds at the time of manufacturing the terminal block 10. Since the positioning performance of the terminal 16 with respect to the shield shell 20 can be improved in this way, a gap dimension between the facing surfaces 38 and 38 of the fixing portion 22 of the terminal 16 and the holding tube portion 30 of the shield shell 20 can be made as small as possible. Therefore, the thickness of the filling resin portion 40 arranged between the facing surfaces 38 and 38 can be reduced to a resilience limit and the heat dissipation performance from the terminal 16 to the shield shell 20 via the filling resin portion 40 can be more advantageously improved. Further, since the contact portion 33 with the case 21 serving as the external heat dissipation target can be formed, utilizing the fixing projection piece 32 provided on the shield shell 20, the contact portion 33 can be provided with a small number of components and both the size reduction and the heat dissipation performance of the terminal 10 can be achieved.

The filling resin portion 40 includes the flange portion 46 projecting from the first opening 44 of the holding tube portion 30 on the side of the receptacle 18 and expanding to cover the bottom surface 36 of the receptacle 18. Thus, the fixing performance of the filling resin portion 40 to the shield shell 20 can be advantageously improved while creepage distances of the terminal 16 and the shield shell 20 are secured with a high degree of freedom in design by adjusting the size of the flange portion 46. Moreover, the facing surfaces 38, 38 of the fixing portion 22 and the holding tube portion 30 are covered by the flange portion 46. In this way, the occurrence of troubles such as a reduction in heat dissipation performance due to the peeling of the filling resin portion 40 from the fixing portion 22 and/or the holding tube portion 30 between the facing surface 38 and 38 is advantageously suppressed or prevented. Further, the filling resin portion 40 includes the projecting portion 50 projecting from the second opening 48 of the holding tube portion 30 on the side opposite to the receptacle 18 and exposed to outside. Thus, the creepage distances of the holding tube portion 30 and the case 21 or the like can be secured with a high degree of freedom in design by appropriately adjusting a length of the projecting portion 50. Moreover, even if waterdrops adhere near the second opening 48, the occurrence of troubles such as the waterdrops entering and staying between the facing surfaces 38, 38 of the fixing portion 22 and the holding tube portion 30 can also be prevented.

<Modifications>

Although the embodiment has been described in detail as a specific example of the present disclosure above, the present disclosure is not limited by this specific description. The present disclosure encompasses modifications, improvements and the like within such a range that the aim of the present disclosure can be achieved. For example, the following modifications of the embodiment are also included in the technical scope of the present disclosure.

(1) Although the pair of terminals 16 are provided in the above embodiment, one, three or more terminals may be provided. Further, the receptacle 18 is not limited to the single one, and a plurality of receptacles for individually surrounding the plurality of connecting portions 14 may be used.

(2) Although the shield shell 20 is arranged on the outermost side in the above embodiment, there is no limitation to this. If the contact portion 33 of the shield shell is capable of contacting the external heat dissipation target, the shield shell 20 may be accommodated in a housing made of synthetic resin.

LIST OF REFERENCE NUMERALS

10 . . . terminal block
12 . . . mating terminal
14 . . . connecting portion
16 . . . terminal
18 . . . receptacle
20 . . . shield shell
21 . . . case (external heat dissipation target)
22 . . . fixing portion
24 . . . fastening portion
26 . . . bolt insertion hole
28 . . . recess
30 . . . holding tube portion
32 . . . fixing projection piece
33 . . . contact portion
34 . . . insertion hole
35 . . . communication hole
36 . . . bottom surface
38 . . . facing surface
40 . . . filling resin portion
42 . . . engaging protrusion
44 . . . first opening
46 . . . flange portion
48 . . . second opening
50 . . . projecting portion
52 . . . tip surface
54 . . . side surface
56 . . . upper surface
58 . . . lower surface

What is claimed is:

1. A terminal block, comprising:
a terminal including a connecting portion to be connected to a mating terminal on a tip side and a fixing portion on a base end side;
a shield shell made of metal, the shield shell including a tubular receptacle for surrounding the connecting portion of the terminal, a holding tube portion for surrounding the fixing portion of the terminal and a contact portion to be held in thermal contact with an external heat dissipation target; and
a filling resin portion for integrally fixing the fixing portion of the terminal to the holding tube portion of the shield shell by filling up between facing surfaces of the fixing portion of the terminal and the holding tube portion of the shield shell,
wherein the filling resin portion includes a flange portion projecting from a first opening of the holding tube portion on a receptacle side and expanding to cover a bottom surface of the receptacle.

2. The terminal block according to claim 1, wherein the filling resin portion includes a projecting portion projecting from a second opening of the holding tube portion on a side opposite to the receptacle and exposed to the outside.

3. The terminal block according to claim 1, wherein the fixing portion of the terminal is provided with a recess open on an outer surface, and the filling resin portion includes an engaging protrusion for filling the recess.

4. The terminal block according to claim 1, wherein:
the connecting portion has a flat plate shape extending in a longitudinal direction of the terminal while having a rectangular cross-section, and
a tip surface, both side surfaces, an upper surface and a lower surface of the connecting portion are not covered by the filling resin portion at least on a tip side of the connecting portion.

5. The terminal block according to claim 1, wherein a thickness of the filling resin portion arranged between the facing surfaces of the fixing portion of the terminal and the holding tube portion of the shield shell is 1.5 mm or less.

6. The terminal block according to claim 1, wherein the shield shell includes a fixing projection piece expanding into a flange shape around the receptacle, and the contact portion of the shield shell is constituted by an overlapping surface of the fixing projection piece on the heat dissipation target.

7. The terminal block according to claim 1, wherein a contact surface between the contact portion and the external heat dissipation target overlaps the terminal and the filling resin portion in the holding tube portion, in a direction orthogonal to a longitudinal direction of the terminal, and heat generated in the terminal is dissipated to the external heat dissipation target via the filling resin portion and the shield shell.

8. A terminal block, comprising:

a terminal including a connecting portion to be connected to a mating terminal on a tip side and a fixing portion on a base end side;

a shield shell made of metal, the shield shell including a tubular receptacle for surrounding the connecting portion of the terminal, a holding tube portion for surrounding the fixing portion of the terminal and a contact portion to be held in thermal contact with an external heat dissipation target; and a filling resin portion for integrally fixing the fixing portion of the terminal to the holding tube portion of the shield shell by filling up between facing surfaces of the fixing portion of the terminal and the holding tube portion of the shield shell, wherein the filling resin portion includes a projecting portion projecting from a second opening of the holding tube portion on a side opposite to the receptacle and exposed to outside.

9. A terminal block, comprising:

a terminal including a connecting portion to be connected to a mating terminal on a tip side and a fixing portion on a base end side;

a shield shell made of metal, the shield shell including a tubular receptacle for surrounding the connecting portion of the terminal, a holding tube portion for surrounding the fixing portion of the terminal and a contact portion to be held in thermal contact with an external heat dissipation target; and a filling resin portion for integrally fixing the fixing portion of the terminal to the holding tube portion of the shield shell by filling up between facing surfaces of the fixing portion of the terminal and the holding tube portion of the shield shell, wherein the fixing portion of the terminal is provided with a recess open on an outer surface, and the filling resin portion includes an engaging protrusion for filling the recess.

* * * * *